United States Patent
Parameswaran et al.

(10) Patent No.: US 7,821,327 B2
(45) Date of Patent: Oct. 26, 2010

(54) HIGH VOLTAGE INPUT RECEIVER USING LOW VOLTAGE TRANSISTORS

(75) Inventors: Pramod Elamannu Parameswaran, Karnataka (IN); Pankaj Kumar, Karnataka (IN)

(73) Assignee: LSI Corporation, Milpitas, CA (US)

( * ) Notice: Subject to any disclaimer, the term of this patent is extended or adjusted under 35 U.S.C. 154(b) by 100 days.

(21) Appl. No.: 12/185,073

(22) Filed: Aug. 2, 2008

(65) Prior Publication Data

US 2010/0026342 A1 Feb. 4, 2010

(51) Int. Cl.
G05F 1/10 (2006.01)
H03K 3/356 (2006.01)
(52) U.S. Cl. .................. 327/536; 327/206; 327/541; 327/545; 327/539; 327/309; 327/296; 326/83
(58) Field of Classification Search .................. 327/540, 327/530, 536, 309, 274, 142
See application file for complete search history.

(56) References Cited

U.S. PATENT DOCUMENTS

| | | | | |
|---|---|---|---|---|
| 5,297,097 A | * | 3/1994 | Etoh et al. ................... 365/226 |
| 5,952,733 A | * | 9/1999 | Johnston ....................... 307/44 |
| 6,163,183 A | * | 12/2000 | Azimi et al. .................. 327/142 |
| RE37,593 E | * | 3/2002 | Etoh et al. ............. 365/189.09 |
| 6,664,841 B1 | * | 12/2003 | Cetin et al. .................. 327/309 |
| 6,693,780 B2 | * | 2/2004 | Spehar et al. ................. 361/56 |
| 6,919,755 B2 | * | 7/2005 | Egerer et al. ................. 327/530 |
| 7,616,049 B2 | * | 11/2009 | Yoon ........................... 327/536 |
| 2002/0175729 A1 | * | 11/2002 | Cyrusian ..................... 327/274 |

* cited by examiner

*Primary Examiner*—Vibol Tan
(74) *Attorney, Agent, or Firm*—Prakash Nama; Global IP Services, PLLC

(57) ABSTRACT

A high voltage input receiver using low voltage transistors is disclosed. In one embodiment, an input receiver circuit includes a comparator circuit and an inverter circuit. The comparator circuit includes a differential input module for generating a control signal by comparing an external voltage and a reference voltage, and a decision module for generating an inverter input signal based on the control signal. In addition, the reference voltage is used to set dc trip point of the input receiver. Moreover, the input receiver includes one or more stress protection modules to protect key components of the input receiver from exceeding their reliability limits.

20 Claims, 6 Drawing Sheets

HIGH VOLTAGE INPUT RECEIVER USING LOW VOLTAGE TRANSISTORS

FIELD OF TECHNOLOGY

Embodiments of the present invention relate to the field of electronics. More particularly, embodiments of the present invention relate to an input receiver.

BACKGROUND

An input receiver (e.g., a low voltage complementary metal oxide semiconductor (LVCMOS) receiver) downconverts an external signal (e.g., a pad signal) to feed the downconverted signal to the core of a semiconductor chip at a required voltage level. That is, the input receiver interfaces with the external signal at an input/output (I/O) supply voltage level and converts the external signal to the required voltage level. Currently, the input receiver employs an inverter or buffer like architecture which fixes its dc trip point based on the size of the input receiver. The dc trip point of the input receiver may be fixed at half the I/O supply voltage. Thus, if the external signal of the input receiver is greater than the dc trip point, then it is converted to the supply voltage level of the input receiver, whereas if the external signal is less than the dc trip point, then it is converted to zero voltage.

The arrangement may work well when the I/O supply voltage level (e.g., 1.8 volts) is equal or less than the maximum voltage (e.g., 1.8 volts) the transistors in the input receiver can sustain. However, for the I/O supply level (e.g., 2.5 volts or 3.3 volts) greater than the maximum voltage (e.g., 1.8 volts) the transistors can sustain, the design may stress the transistors, thus degrading the performance of the input receiver. For example, the design of the input receiver may have to be heavily skewed to meet the LVCMOS joint electron device engineering council (JEDEC) switching thresholds for higher supply voltages (e.g., 3.3 volts), and the distortion in the design of the input receiver may degrade the performance of the input receiver.

The performance degradation can be corrected by setting the dc trip point at the appropriate level. However, according to the current architecture of the input receiver, the trip point of the input receiver is determined by the components' size of the input receiver and/or the supply voltage level of input receiver. As a result, the inflexible nature of the input receiver in setting the dc trip point may hinder improving the performance of the input receiver.

SUMMARY

A high voltage input receiver using low voltage transistors is disclosed. In one aspect, an input receiver system includes a comparator for comparing an external voltage and a reference voltage. The comparator includes a differential input module for generating a control signal by comparing the external voltage and the reference voltage, and a decision module for generating an inverter input signal based on the control signal. The input receiver system also includes an inverter for generating an output signal based on the inverter input signal. The reference voltage sets dc trip point of the input receiver.

In another aspect, an input receiver circuit includes a comparator circuit including a differential input module and a decision module. Further, the differential input module includes a differential amplifier with the external voltage coupled to a negative input node of the differential amplifier and the reference voltage coupled to a positive input node of the differential amplifier, a tail current source coupled to the differential amplifier, and two loads coupled to two legs of the differential amplifier. The tail current source is coupled to a ground and the two loads are coupled to an input/output (I/O) supply voltage. The decision module includes a pass transistor for regulating a flow of a current via the pass transistor based on the control signal, and a current sink. The pass transistor is turned off if the external voltage is less than the reference voltage. The input receiver circuit further includes an inverter circuit for generating an output signal based on the inverter input signal.

The systems and apparatuses disclosed herein may be implemented in any means for achieving various aspects. Other features will be apparent from the accompanying drawings and from the detailed description that follows.

BRIEF DESCRIPTION OF THE DRAWINGS

Embodiments of the present invention are illustrated by way of an example and not limited to the figures of the accompanying drawings, in which like references indicate similar elements and in which.

Other features of the present embodiments will be apparent from the accompanying drawings and from the detailed description that follows.

DETAILED DESCRIPTION

A high voltage input receiver using low voltage transistors is disclosed. In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
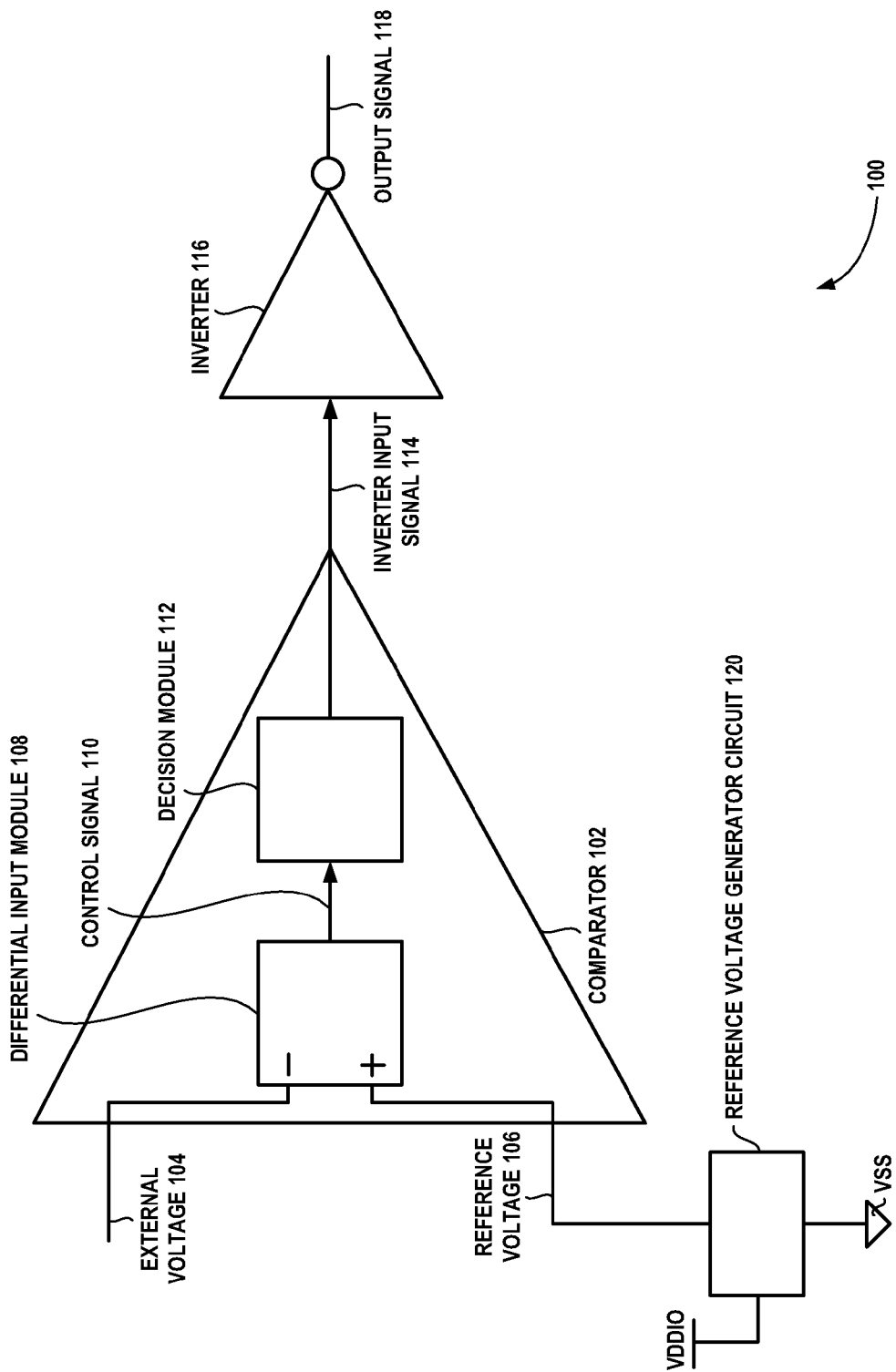
FIG. 1 is a block diagram of an exemplary input receiver system, according to one embodiment.

FIG. 1 is a block diagram of an exemplary input receiver system 100, according to one embodiment. Particularly, the input receiver system 100 includes a comparator 102 for comparing an external voltage 104 and a reference voltage 106. In one example embodiment, the external voltage 104 is a pad voltage, and the reference voltage 106 is setting dc trip point. As shown in FIG. 1, the comparator 102 includes a differential input module 108 and a decision module 112. In one embodiment, the differential input module 108 generates a control signal 110 by comparing the external voltage 104 and the reference voltage 106.

The input receiver system 100 also includes a reference voltage generator circuit 120 coupled to the comparator 102 for generating the reference voltage 106. In one example embodiment, the reference voltage generator circuit 120 includes a voltage divider circuit. It is appreciated that, the DC trip point of the input receiver system 100 is achieved by properly selecting the reference voltage 106. For example, the reference voltage 106 is selected such that the reference voltage 106 is centralized within the JEDEC (Joint Electron Device Engineering Council) switching threshold range. In one example embodiment, the reference voltage 106 is set between input high voltage ($V_{IH}$) and input low voltage ($V_{IL}$) of the JEDEC switching threshold range. Further, the decision module 112 generates an inverter input signal 114 based on the control signal 110.

Figure 2:
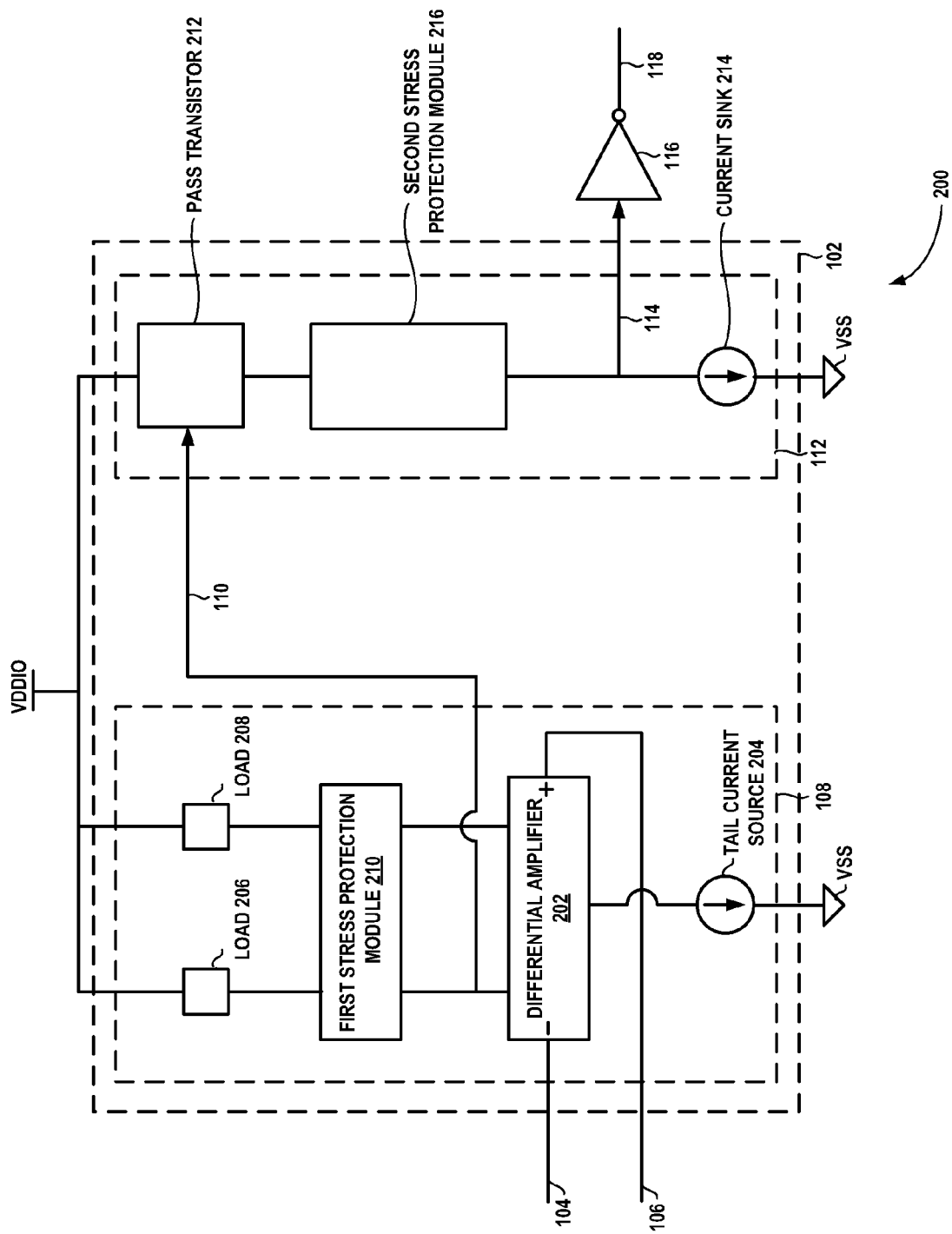
FIG. 2 is an exemplary module level diagram of the input receiver system of FIG. 1, according to one embodiment.

Further as shown in FIG. 1, the input receiver system 100 includes an inverter 116 for generating an output signal 118 based on the inverter input signal 114. It is appreciated that, the inverter 116 inverts the inverter input signal 114 to a core voltage level. In one example embodiment, the external voltage 104 supplied to the comparator 102 is 2.5/3.3 volts and the output signal 118 (i.e., at core voltage level) is approximately 1.0 volts. Further, the output signal 118 can be converted to a core voltage (e.g., the inverted core voltage 402 and 502 of FIG. 4 and FIG. 5, respectively) of the associated chip. Further, each of the comparator 102 and the inverter 116 includes a plurality of thin oxide transistors. The block diagram for the input receiver system 100 is illustrated in FIG. 2. It is appreciated that the input receiver system 100 can be implemented to a semiconductor device or chip to convert an external voltage (e.g., a pad voltage) of the device to its core voltage.

FIG. 2 is an exemplary module level diagram of the input receiver system 100 of FIG. 1, according to one embodiment. Particularly, FIG. 2 illustrates various blocks associated with the differential input module 108 and the decision module 112. As mentioned above, the comparator 102 includes the differential input module 108 for generating the control signal 110 by comparing the external voltage 104 and the reference voltage 106, and the decision module 112 for generating the inverter input signal 114 based on the control signal 110.

As shown in FIG. 2, the differential input module 108 includes a differential amplifier 202, with the external voltage 104 coupled to a negative input node of the differential amplifier 202 and the reference voltage 106 coupled to a positive input node of the differential amplifier 202. The differential input module 108 also includes a tail current source 204 coupled to the differential amplifier 202.

Further, the differential input module 108 includes two loads (i.e., load 206 and load 208) coupled to two legs of the differential amplifier 202 via a first stress protection module 210. In one example embodiment, the differential input module 108 includes the first stress protection module 210 connected between the differential amplifier 202 and the two loads to prevent the differential amplifier 202 from exceeding a reliability limit of the differential amplifier 202.

For example, the reliability limit refers to a maximum voltage level within which transistors in the differential input stage (e.g., the differential amplifier 202) is allowed to operate. In other words, if voltage across the differential amplifier 202 passes the reliability limit, then the differential amplifier 202 is considered as stressed, that is the voltage across transistor terminals in the differential amplifier 202 is more than the reliability limit. For example, a 1.8 V transistor can reliably operate up to a maximum voltage of 1.8+10%, i.e., 1.98 V. In one exemplary implementation, the tail current source 204 is coupled to a ground (VSS) and the two loads (i.e., the load 206 and the load 208) are coupled to an input/output (I/O) supply voltage (VDDIO).

Further as shown in FIG. 2, the decision module 112 includes a pass transistor 212 for regulating a flow of a current based on the control signal 110, which is the output of the differential input module 108, and a current sink 214. In one example embodiment, the decision module 112 includes a second stress protection module 216 coupled between the pass transistor 212 and the current sink 214 to prevent the pass transistor 212 from exceeding a reliability limit of the pass transistor 212 and to prevent the current sink 214 from exceeding a reliability limit of the current sink 214.

In one embodiment, the pass transistor 212 is turned off if the external voltage 104 is less than the reference voltage 106. As mentioned above, the decision module 112 generates the inverter input signal 114 based on the control signal 110. In addition, the inverter 116 generates the output signal 118 based on the inverter input signal 114. The circuit diagram for the input receiver system 100 of FIG. 1 is illustrated in FIG. 3.

Figure 3:
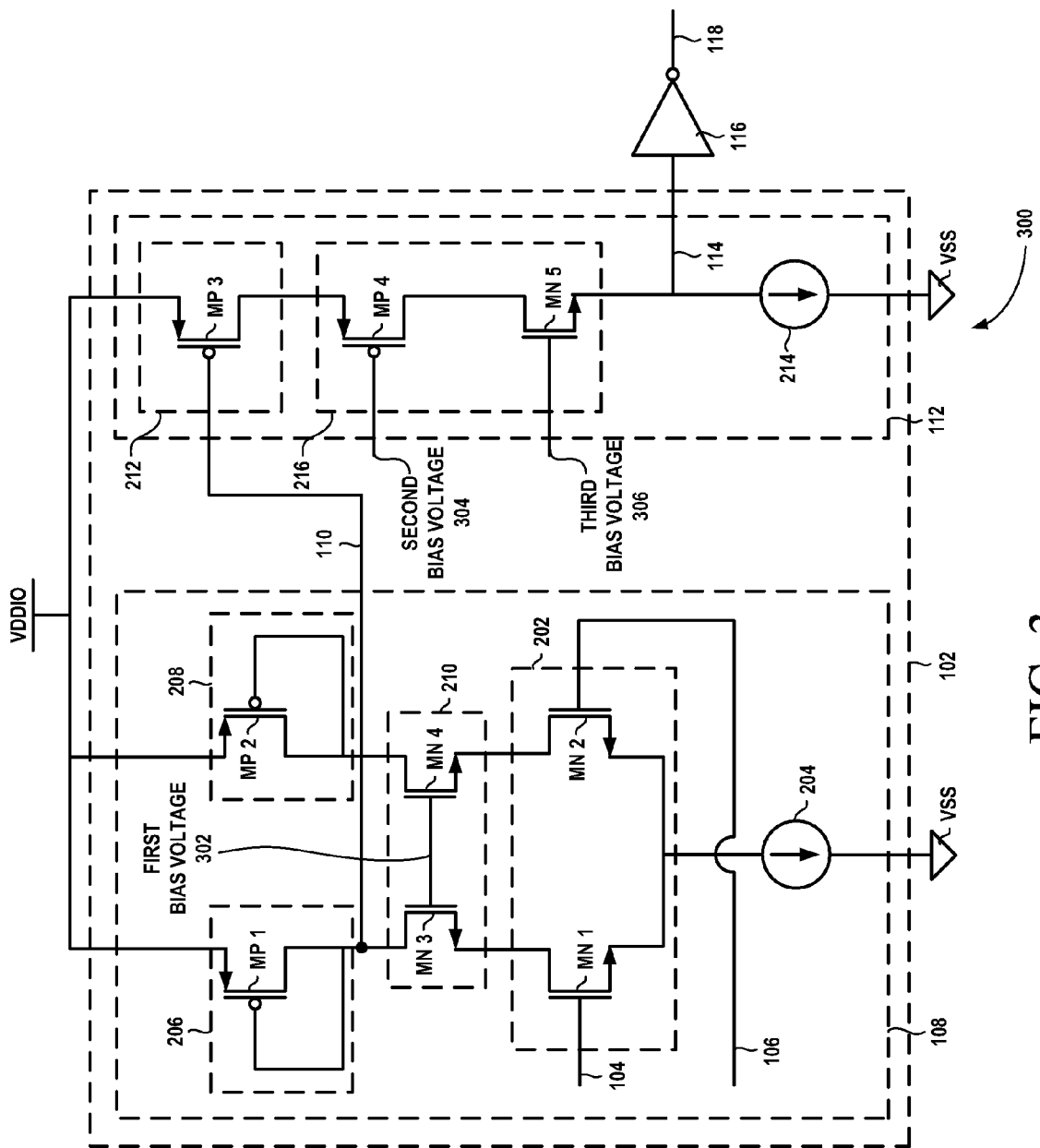
FIG. 3 is an exemplary circuit diagram of the input receiver system of FIG. 1, according to one embodiment.

FIG. 3 is an exemplary circuit diagram 300 of the input receiver system 100 of FIG. 1, according to one embodiment. Particularly, the circuit diagram 300 includes a comparator circuit (e.g., the comparator 102 as illustrated in FIG. 3) and an inverter circuit (e.g., the inverter 116 as illustrated in FIG. 3). As shown in FIG. 3, the comparator circuit 102 includes the differential input module 108 and the decision module 112. The differential input module 108 includes the differential amplifier 202, the tail current source 204, the loads (e.g., the load 206 and the load 208), and the first stress protection module 210.

Further as shown in FIG. 3, the differential amplifier 202 includes two NMOS transistors (MN 1 and MN 2), the tail current source 204 includes an NMOS transistor, the first stress protection module 210 includes two NMOS transistors (MN 3 and MN 4), and each of the two loads (e.g., the load 206 and the load 208) includes a PMOS transistor (MP 1 and MP 2, respectively). In one exemplary implementation, two respective gates of the two NMOS transistors (MN 3 and MN 4) in the first stress protection module 210 are biased with a first bias voltage 302 such that each of voltages at drains of the two NMOS transistors (MN 1 and MN 2) in the differential amplifier 202 does not exceed the first bias voltage 302 minus threshold voltage of the NMOS transistors (MN 3 and MN 4) in the first stress protection module 210. As illustrated in FIG. 3, the control signal 110 is a drain voltage of an NMOS transistor (MN 3) associated with the external voltage 104.

Further as shown in FIG. 3, the decision module 112 includes the pass transistor 212, the current sink 214, and the second stress protection module 216. The pass transistor 212 includes a PMOS load (MP 3), and the second stress protection module 216 includes a PMOS transistor (MP 4) and an NMOS transistor (MN 5) connected in series. In one exemplary implementation, the PMOS transistor (MP 4) of the second stress protection module 216 is biased with a second bias voltage 304 such that a drain voltage of the PMOS load (MP 3) does not fall below the second bias voltage 304 plus a threshold voltage of the PMOS transistor (MP 4) of the second stress protection module 216.

Further, the NMOS transistor (MN 5) of the second stress protection module 216 is biased with a third bias voltage 306 such that the current sink 214 is prevented from exceeding the third bias voltage 306 minus a threshold voltage of the NMOS transistor (MN 5) of the second stress protection module 216.

In operation, the pass transistor 212 is turned off if the external voltage 104 is less than the reference voltage 106. The inverter input signal 114 is a source voltage of the NMOS transistor (MN 5) of the second stress protection module 216. In addition, the inverter circuit 116 generates the output signal 118 based on the inverter input signal 114. In one example embodiment, the output signal 118 can be inverted to a core voltage (e.g., the core voltage 402 and 502 of FIG. 4 and FIG. 5 respectively).

In accordance with the above described embodiments with respect to FIG. 3, the functioning of the circuit diagram 300 (e.g., the input receiver circuit) is as follows. In operation, when the external voltage 104 changes from high to low or low to high, current switches from one leg to other leg in the differential input module 108 (i.e., while the external voltage 104 crosses the reference voltage 106). The change is mirrored to a push pull output driver (e.g., includes the MP 3, MP 4, MN 5, and the NMOS transistor associated with the current sink 214).

In operation, the output of the differential input module 108 (e.g., the control signal 110) switches between VDDIO and VDDIO-load drop (e.g., decided by the current through the legs associated with either MP 1 or MP 2) based on the external voltage 104. In the example embodiment illustrated in FIG. 3, the PMOS transistor (MP 1) and the PMOS transistor (MP 2) function as loads. When the external voltage 104 is going low, the control signal 110 reaches close to VDDIO and turns off the pull up portion (e.g., the MP 3) of the push pull stage. Consequently, the transistor in the current sink 214 pulls down the inverter input signal 114 to low.

Further, when the external voltage 104 is going high, the control signal 110 drives current through the PMOS transistor (MP 3) and the inverter input signal 114 is based on the voltage division in the push pull output driver. Hence, the inverter input signal 114 swings between 0 and the third bias voltage 306 minus a threshold voltage of the NMOS transistor (MN 5). The inverter circuit 116 then inverts the inverter input signal 114 to output voltage 118, which can be inverted to the core voltage (e.g., the core voltage 402 and 502 of FIG. 4 and FIG. 5 respectively) using another inverter. In one embodiment, the core voltage is an inverted output signal 118. It is appreciated that, the second bias voltage 304 and the third bias voltage 306 are selected in such a manner that avoids the stressing of the transistors (i.e., the MP 3 and the transistor in the current sink 214) in the decision module 112. The input and output plots associated with the input receiver system 100 are illustrated in FIG. 4 and FIG. 5.

Figure 4:
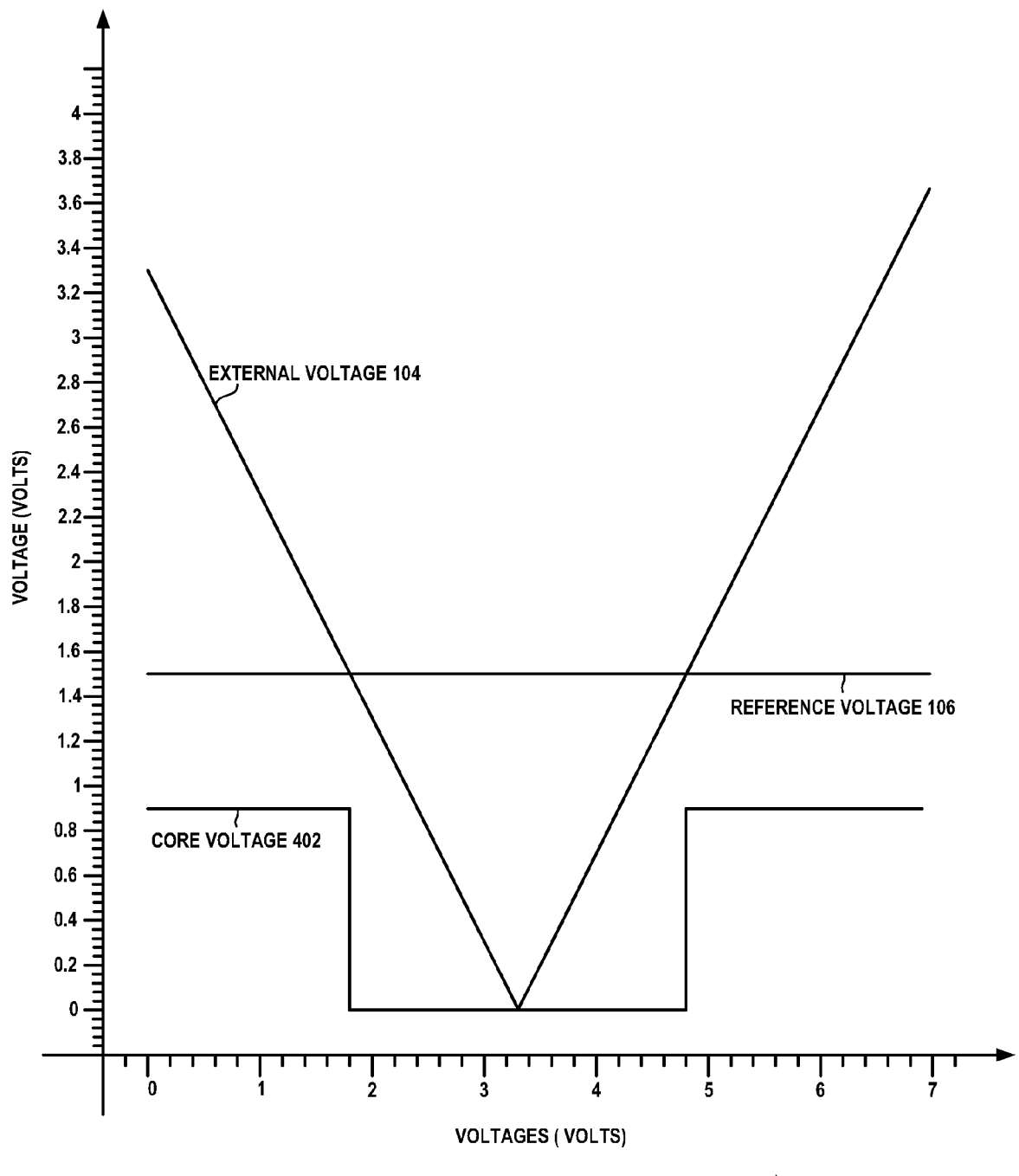
FIG. 4 is a graphical view of an exemplary DC response of the input receiver system in FIG. 1, according to one embodiment.

FIG. 4 is a graphical view of an exemplary DC response 400 of the input receiver system 100 in FIG. 1, according to one embodiment. Particularly, FIG. 4 illustrates DC characteristics obtained through simulation results of the input receiver system 100 in FIG. 1. FIG. 4 illustrates the external voltage 104 supplied to the negative input node of the differential amplifier 202, and the reference voltage 106 supplied to the positive input node of the differential amplifier 202. The comparator 102 compares the external voltage 104 and the reference voltage 106 and generates a resultant core voltage 402. In one example embodiment, the output voltage 118 of FIG. 1 is inverted to the core voltage 402.

Figure 5:
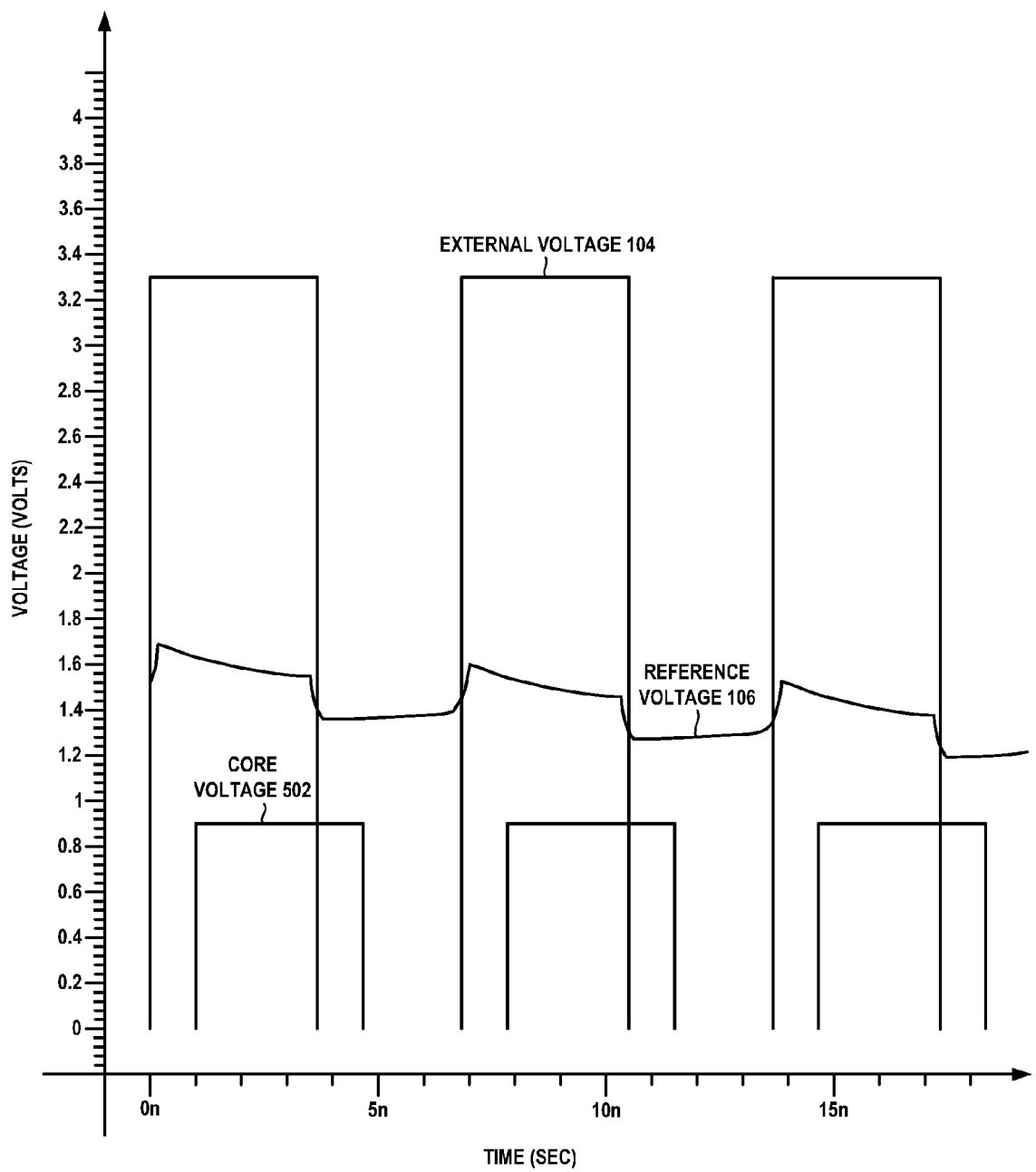
FIG. 5 is a graphical view of an exemplary transient response of the input receiver system in FIG. 1, according to one embodiment.

FIG. 5 is a graphical view of an exemplary transient response 500 of the input receiver system 100 in FIG. 1, according to one embodiment. Particularly, FIG. 5 illustrates voltage (e.g., in volts) versus time (e.g., in nano seconds) characteristics obtained through simulation results of the input receiver system 100 in FIG. 1. FIG. 5 illustrates the external voltage 104 supplied to the negative input node of the differential amplifier 202, and the reference voltage 106 supplied to the positive input node of the differential amplifier 202. The comparator 102 compares the external voltage 104 and the reference voltage 106 and generates a resultant core voltage 502. In one example embodiment, the output voltage 118 of FIG. 1 is inverted to the core voltage 502.

Figure 6:
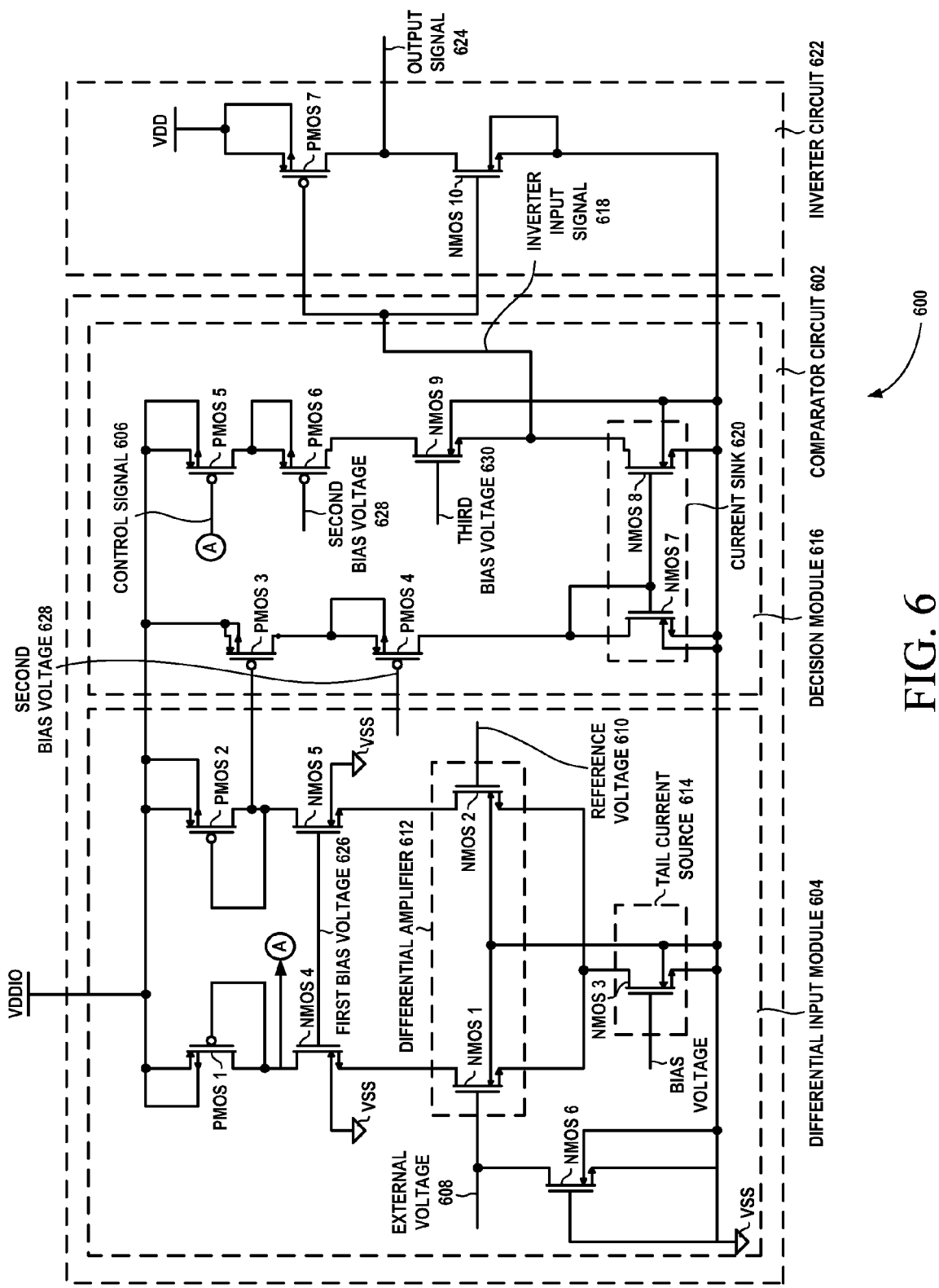
FIG. 6 is another exemplary circuit diagram of the input receiver system of FIG. 1, according to one embodiment.

FIG. 6 is another exemplary circuit diagram 600 of the input receiver system 100 of FIG. 1, according to one embodiment. Particularly, the circuit diagram 600 (e.g., the input receiver circuit) includes a comparator circuit 602 and an inverter circuit 622. The comparator circuit 602 includes a differential input module 604 for generating a control signal 606 by comparing an external voltage 608 and a reference voltage 610.

Further as shown in FIG. 6, the differential input module 604 includes a differential amplifier 612 based on a first NMOS transistor (NMOS 1) and a second NMOS transistor (NMOS 2). In one exemplary implementation, the external voltage 608 is coupled to a negative input node of the differential amplifier 612, and the reference voltage 610 is coupled to a positive input node of the differential amplifier 612. The differential input module 604 also includes a tail current source 614 based on a third NMOS transistor (NMOS 3) coupled to the differential amplifier 612.

The differential input module 604 further includes a fourth NMOS transistor (NMOS 4) and a fifth NMOS transistor (NMOS 5) coupled to the differential amplifier 612 to prevent the differential amplifier 612 from exceeding a reliability limit of the differential amplifier 612. In one example embodiment, the reliability limit is a maximum voltage within which the differential amplifier 612 is allowed to operate. In addition, the differential input module 604 includes a first PMOS transistor (PMOS 1) and a second PMOS transistor (PMOS 2) coupled to the fourth NMOS transistor (NMOS 4) and the fifth NMOS transistor (NMOS 5), respectively. As shown in FIG. 6, the tail current source 614 is coupled to a ground (VSS) and the first PMOS transistor (PMOS 1) and the second PMOS transistor (PMOS 2) are coupled to an input/output (I/O) supply voltage (VDDIO).

Further as shown in FIG. 6, the comparator circuit 602 includes a decision module 616 for generating an inverter input signal 618 based on the control signal 606. In one exemplary implementation, the decision module 616 includes a current sink 620 based on a seventh NMOS transistor (NMOS 7) and an eighth NMOS transistor (NMOS 8), forming a current mirror. The decision module 616 also includes a third PMOS transistor (PMOS 3) coupled in series with a fourth PMOS transistor (PMOS 4) and the seventh NMOS transistor (NMOS 7). The decision module 616 further includes a fifth PMOS transistor (PMOS 5), coupled in series with a sixth PMOS transistor (PMOS 6), a ninth NMOS transistor (NMOS 9) and the eighth NMOS transistor (NMOS 8) for regulating a flow of a current based on the control signal 606.

In operation, the fifth PMOS transistor (PMOS 5) is turned off if the external voltage 608 is less than the reference voltage 610. Further, the sixth PMOS transistor (PMOS 6) prevents the fifth PMOS transistor (PMOS 5) from exceeding a reliability limit of the fifth PMOS transistor (PMOS 5), and the ninth NMOS transistor (NMOS 9) prevents the eighth NMOS transistor (NMOS 8) from exceeding a reliability limit of the eighth NMOS transistor (NMOS 8). Further as shown in FIG. 6, the inverter circuit 622 (e.g., based on a seventh PMOS transistor (PMOS 7) and a tenth NMOS transistor (NMOS 10)) generates an output signal 624 based on the inverter input signal 618.

In one exemplary implementation, respective gates of the fourth NMOS transistor (NMOS 4) and the fifth NMOS transistor (NMOS 5) are biased with a first bias voltage 626 such that a drain voltage of the first NMOS transistor (NMOS 1) and a drain voltage of the second NMOS transistor (NMOS 2) does not exceed the first bias voltage 626 minus a threshold voltage of the fourth NMOS transistor (NMOS 4) or the fifth NMOS transistor (NMOS 5). Further, the sixth PMOS transistor (PMOS 6) is biased with a second bias voltage 628 such that a drain voltage of the fifth PMOS transistor (PMOS 5) does not fall below the second bias voltage 628 plus a threshold voltage of the sixth PMOS transistor (PMOS 6). In addition, the ninth NMOS transistor (NMOS 9) is biased with a third bias voltage 630 such that the eighth NMOS transistor (NMOS 8) is prevented from exceeding the third bias voltage 630 minus a threshold voltage of the ninth NMOS transistor (NMOS 9).

In accordance with the above described embodiments with respect to FIG. 6, the functioning of the circuit diagram 600 (e.g., the input receiver circuit) is explained as follows. In operation, when the external voltage 608 changes from high to low or low to high, current switches from one leg to other leg in the differential input module 604, while the external voltage 608 crosses the reference voltage 610, and the change is mirrored to a push pull output driver (e.g., which includes the PMOS 5, PMOS 6, NMOS 9, and NMOS 8). In one exemplary implementation, the eighth NMOS transistor (NMOS 8) determines the output signal (e.g., the inverter input signal 618) of the decision module 616.

In operation, the output of the differential input module 604 (e.g., the control signal 606) switches between VDDIO and VDDIO-load drop, which decided by the current in that leg, based on the external voltage 608 and the reference voltage 610. In the example embodiment illustrated in FIG. 6, the first PMOS transistor (PMOS 1) and the second PMOS transistor (PMOS 2) function as loads. When the external voltage 608 goes low, the control signal 606 reaches close to VDDIO and turns off the pull up portion (e.g., the PMOS 5) of the push pull output driver. Consequently, the eighth transistor NMOS 8 pulls down the inverter input signal 618 to low.

Further, when the external voltage 608 goes high, the control signal 606 drives current through the fifth PMOS transistor (PMOS 5) and the inverter input signal 618 is based on the voltage division in the push pull output driver. Hence, the inverter input signal 618 swings between 0 and the third bias voltage 630 minus a threshold voltage of the ninth NMOS transistor (NMOS 9). The inverter circuit 622 then downconverts the inverter input signal 618 to the output signal 624. In one embodiment, the output signal 624 can be converted to the core voltage using an inverter. It is appreciated that, the second bias voltage 628 and the third bias voltage 630 are selected in such a manner to avoid stressing of the transistors (i.e., PMOS 5 and NMOS 8) in the decision module 616.

In one embodiment, the sixth PMOS transistor (PMOS 6) and ninth NMOS transistor (NMOS 9) are used to avoid stress in the fifth PMOS transistor (PMOS 5) and the eighth NMOS transistor (NMOS 8) respectively. For example, when the fifth PMOS transistor (PMOS 5) conducts, i.e., turns on, the ninth NMOS transistor (NMOS 9) ensures that the voltage level gets down sufficiently such that, the eighth NMOS transistor (NMOS 8) is not stressed (e.g., by selecting the third bias voltage 630 accordingly).

Similarly, when the external voltage 608 is going low, the first transistor (PMOS 1) and the fifth PMOS transistor (PMOS 5) goes to cut-off mode, i.e., turns off. Consequently, the sixth PMOS transistor (PMOS 6) clamps source voltage to the second bias voltage 628 plus threshold voltage of the sixth PMOS transistor (PMOS 6), to protect the fifth PMOS transistor (PMOS 5) from stressing (e.g., by selecting the second bias voltage 628 accordingly). In one example embodiment, the fourth NMOS transistor (NMOS 4) and the fifth NMOS transistor (NMOS 5) protect the first NMOS transistor (NMOS 1) and the second NMOS transistor (NMOS 2) respectively, such that the transistors in the differential amplifier 612 do not cross the reliability limit.

The above described input receiver system 100 achieves the dc trip point with ease by properly selecting the reference voltage. The above described input receiver system 100 is used for the JEDEC switching thresholds for higher supply voltages (e.g., 2.5/3.3 volts). The above described input receiver system 100 is scalable for higher external voltages. The above described input receiver system 100 also avoids stressing of the transistors in the input receiver circuit.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated circuitry (ASIC)).

What is claimed is:

1. An input receiver system, comprising:
    a comparator for comparing an external voltage and a reference voltage, comprising:
        a differential input module for generating a control signal by comparing the external voltage and the reference voltage, wherein the differential input module comprises:
            a differential amplifier with the external voltage coupled to a negative input node of the differential amplifier and the reference voltage coupled to a positive input node of the differential amplifier;
            a tail current source coupled to the differential amplifier;
            two loads coupled to two legs of the differential amplifier and wherein the tail current source is coupled to a ground and the two loads are coupled to an input/output (I/O) supply voltage; and
            a first stress protection module connected between the differential amplifier and the two loads for preventing the differential amplifier from exceeding a reliability limit of the differential amplifier; and
        a decision module for generating an inverter input signal based on the control signal; and
    an inverter for generating an output signal based on the inverter input signal, and wherein the reference voltage sets a dc trip point.

2. The system of claim 1, wherein the differential amplifier comprises two NMOS transistors, the tail current source comprises an NMOS transistor, the first stress protection module comprises two NMOS transistors, and each of the two loads comprises a PMOS transistor.

3. The system of claim 2, wherein two respective gates of the two NMOS transistors in the first stress protection module is biased with a first bias voltage such that each of voltages at drains of the two NMOS transistors in the differential amplifier does not exceed the first bias voltage minus threshold voltage of the NMOS transistors in the first stress protection module.

4. The system of claim 3, wherein the control signal is a drain voltage of an NMOS transistor of the two NMOS transistors in the differential amplifier associated with the external voltage.

5. An input receiver system, comprising:
    a comparator for comparing an external voltage and a reference voltage, comprising:
        a differential input module for generating a control signal by comparing the external voltage and the reference voltage; and
        a decision module for generating an inverter input signal based on the control signal, wherein the decision module comprises:
            a pass transistor for regulating a flow of a current based on the control signal; and
            a current sink and wherein the pass transistor is turned off if the external voltage is less than the reference voltage; and
    an inverter for generating an output signal based on the inverter input signal, wherein the reference voltage sets a dc trip point.

6. The system of claim 5, wherein the decision module further comprises a second stress protection module coupled between the pass transistor and the current sink for preventing the pass transistor from exceeding a reliability limit of the pass transistor and for preventing the current sink from exceeding a reliability limit of the current sink.

7. The system of claim 6, wherein the pass transistor comprises a PMOS load, and the second stress protection module comprises a PMOS transistor and an NMOS transistor connected in series.

8. The system of claim 7, wherein the PMOS transistor of the second stress protection module is biased with a second bias voltage such that a drain voltage of the PMOS load does not fall below the second bias voltage plus a threshold voltage of the PMOS transistor of the second stress protection module.

9. The system of claim 8, wherein the NMOS transistor of the second stress protection module is biased with a third bias voltage such that the current sink is prevented from exceeding the third bias voltage minus a threshold voltage of the NMOS transistor of the second stress protection module.

10. The system of claim 9, wherein the inverter input signal is a source voltage of the NMOS transistor of the second stress protection module.

11. A semiconductor device, comprising:
an input receiver, comprising:
a comparator for comparing an external voltage and a reference voltage, comprising:
a differential input module for generating a control signal by comparing the external voltage and the reference voltage; and
a decision module for generating an inverter input signal based on the control signal, wherein the decision module comprises:
a pass transistor for regulating a flow of a current based on the control signal; and
a current sink and wherein the pass transistor is turned off if the external voltage is less than the reference voltage; and
an inverter for generating an output signal based on the inverter input signal;
wherein the output signal is associated with a core voltage of the input receiver system, wherein the reference voltage sets a dc trip point to the input receiver system.

12. The semiconductor device of claim 11, wherein the external voltage comprises a pad voltage.

13. An input receiver circuit, comprising:
a comparator circuit, comprising:
a differential input module for generating a control signal by comparing an external voltage and a reference voltage, comprising:
a differential amplifier based on a first NMOS transistor and a second NMOS transistor with the external voltage coupled to a negative input node of the differential amplifier and the reference voltage coupled to a positive input node of the differential amplifier;
a tail current source based on a third NMOS transistor coupled to the differential amplifier;
a fourth NMOS transistor and a fifth NMOS transistor coupled to the differential amplifier for preventing the differential amplifier from exceeding a reliability limit of the differential amplifier; and
a first PMOS transistor and a second PMOS transistor coupled to the fourth NMOS transistor and the fifth NMOS transistor, respectively, wherein the tail current source is coupled to a ground and the first PMOS transistor and the second PMOS transistor are coupled to an input/output (I/O) supply voltage; and
a decision module for generating an inverter input signal based on the control signal, comprising:
a current sink based on a seventh NMOS transistor and an eighth NMOS transistor, forming a current mirror;
a third PMOS transistor coupled in series with a fourth PMOS transistor and the seventh NMOS transistor; and
a fifth PMOS transistor, coupled in series with a sixth PMOS transistor, a ninth NMOS transistor and the eighth NMOS transistor, for regulating a flow of a current based on the control signal, wherein the fifth PMOS transistor is turned off if the external voltage is less than the reference voltage; and wherein the sixth PMOS transistor prevents the fifth PMOS transistor from exceeding a reliability limit of the fifth PMOS transistor, and the ninth NMOS transistor prevents the eighth NMOS transistor from exceeding a reliability limit of the eighth NMOS transistor; and an inverter circuit based on a seventh PMOS transistor and a tenth NMOS transistor for generating an output signal based on the inverter input signal; wherein the reference voltage sets a dc trip point.

14. The circuit of claim 13, wherein two respective gates of the fourth NMOS transistor and the fifth NMOS transistor are biased with a first bias voltage such that a drain voltage of the first NMOS transistor and a drain voltage of the second NMOS transistor does not exceed the first bias voltage minus a threshold voltage of the fourth NMOS transistor or the fifth NMOS transistor, wherein the sixth PMOS transistor is biased with a second bias voltage such that a drain voltage of the fifth PMOS transistor does not fall below the second bias voltage plus a threshold voltage of the sixth PMOS transistor and wherein the ninth NMOS transistor is biased with a third bias voltage such that the eighth NMOS transistor is prevented from exceeding the third bias voltage minus a threshold voltage of the ninth NMOS transistor.

15. The system of claim 1, wherein the external voltage comprises a PAD voltage.

16. The system of claim 1, further comprising:
a reference voltage generator circuit coupled to the comparator for generating the reference voltage, wherein the reference voltage generator circuit comprises a voltage divider circuit.

17. The system of claim 1, wherein each of the comparator and the inverter comprises one or more metal oxide semiconductor (MOS) transistors.

18. The system of claim 5, wherein the external voltage comprises a PAD voltage.

19. The system of claim 5, further comprising:
a reference voltage generator circuit coupled to the comparator for generating the reference voltage, wherein the reference voltage generator circuit comprises a voltage divider circuit.

20. The system of claim 5, wherein each of the comparator and the inverter comprises one or more metal oxide semiconductor (MOS) transistors.

* * * * *